(12) United States Patent
Gonzalez et al.

(10) Patent No.: US 6,946,713 B2
(45) Date of Patent: Sep. 20, 2005

(54) MULTIPLE THICKNESS GATE DIELECTRIC LAYERS

(75) Inventors: Fernando Gonzalez, Boise, ID (US); Roger Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 61 days.

(21) Appl. No.: 10/661,414

(22) Filed: Sep. 12, 2003

(65) Prior Publication Data

US 2004/0113229 A1 Jun. 17, 2004

Related U.S. Application Data

(60) Continuation of application No. 09/879,604, filed on Jun. 12, 2001, now Pat. No. 6,653,675, which is a division of application No. 09/252,314, filed on Feb. 18, 1999, now Pat. No. 6,383,861.

(51) Int. Cl.[7] .............................................. H01L 29/76
(52) U.S. Cl. ...................... 257/411; 257/410; 257/296
(58) Field of Search ................... 257/286–313

(56) References Cited

U.S. PATENT DOCUMENTS

| | | |
|---|---|---|
| 4,627,153 A | 12/1986 | Masuoka |
| 4,651,406 A | 3/1987 | Shimizu et al. |
| 4,675,982 A | 6/1987 | Noble, Jr. et al. |
| 4,957,878 A | 9/1990 | Lowrey et al. |
| 5,057,449 A | 10/1991 | Lowrey et al. |
| 5,101,251 A * | 3/1992 | Wakamiya et al. |
| 5,264,724 A | 11/1993 | Brown et al. |
| 5,358,894 A | 10/1994 | Fazan et al. |
| 5,360,769 A | 11/1994 | Thakur et al. |
| 5,376,593 A | 12/1994 | Sandhu et al. |
| 5,393,683 A | 2/1995 | Mathews et al. |
| 5,395,786 A * | 3/1995 | Hsu et al. |
| 5,405,791 A | 4/1995 | Ahmad et al. |
| 5,407,870 A | 4/1995 | Okada et al. |
| 5,463,234 A | 10/1995 | Toriumi et al. |
| 5,502,009 A | 3/1996 | Lin |
| 5,658,811 A * | 8/1997 | Kimura et al. |
| 5,668,035 A * | 9/1997 | Fang et al. |
| 5,731,238 A * | 3/1998 | Cavins et al. |
| 5,843,817 A * | 12/1998 | Lee et al. |
| 5,863,819 A | 1/1999 | Gonzalez |
| 5,960,289 A * | 9/1999 | Tsui et al. |
| 5,966,618 A | 10/1999 | Sun et al. |
| 6,033,998 A | 3/2000 | Aronowitz et al. |
| 6,037,224 A | 3/2000 | Buller et al. |
| 6,110,842 A | 8/2000 | Okuno et al. |
| 6,136,728 A * | 10/2000 | Wang |
| 6,436,771 B1 * | 8/2002 | Jang et al. ................ 438/275 |
| 6,653,675 B2 * | 11/2003 | Gonzalez et al. .......... 257/296 |

FOREIGN PATENT DOCUMENTS

JP 08031958 A * 2/1996

OTHER PUBLICATIONS

Sekine et al., "Self–aligned tungsten strapped source/drain and gate technology realizing the lowest sheet resistance for subquarter micron CMOS," International Electron Devices Meeting, Dec. 1994, IEEE, pp. 493–496.*

* cited by examiner

Primary Examiner—Getsum Abraham
(74) Attorney, Agent, or Firm—Knobbe, Martens, Olson & Bear, LLP

(57) ABSTRACT

Dual gate dielectric constructions and methods therefor are disclosed for different regions on an integrated circuit. In the illustrated embodiment, gate dielectrics in memory array regions of the chip are formed of silicon oxide, while the gate dielectric in the peripheral region comprises a harder material, specifically silicon nitride, and has a lesser overall equivalent oxide thickness. The illustrated peripheral gate dielectric has an oxide-nitride-oxide construction. The disclosed process includes forming silicon nitride over the entire chip followed by selectively etching off the silicon nitride from the memory array region, without requiring a separate mask as compared to conventional processes. After the selective etch, oxide is grown over the entire chip, growing differentially thicker in the memory array region.

8 Claims, 9 Drawing Sheets

MULTIPLE THICKNESS GATE DIELECTRIC LAYERS

REFERENCE TO RELATED APPLICATION

This application is a continuation of prior U.S. patent application Ser. No. 09/879,604, filed on Jun. 12, 2001, now U.S. Pat. No. 6,653,675, issued on Nov. 25, 2003, which is a divisional of prior U.S. patent application Ser. No. 09/252, 314, filed Feb. 18, 1999, entitled METHOD OF FABRICATING A DUAL GATE DIELECTRIC, now U.S. Pat. No. 6,383,861 issued on May 7, 2002.

BACKGROUND OF THE INVENTION

1. Field of the Invention

The present invention relates generally to gate dielectrics for integrated circuit transistors. More particularly, the invention relates to processes and structures for optimizing the thickness of gate dielectrics.

2. Description of the Related Technology

In the field of integrated circuit fabrication, current leakage through thin dielectric layers presents a continuing challenge to device integration. Leakage through gate dielectrics of field effect transistors (FETs) is known as Fowler-Nordheim currents, while gate induced diode leakage (GIDL) occurs at the edge of the gate electrode. As the gate dielectrics, which are typically formed of silicon oxide, become increasingly thinner due to continued scaling of integrated circuits in pursuit of faster and more efficient circuit operation, GIDL occurs even during transistor off states.

Certain integrated devices, such as transistors within memory arrays of a dynamic random access memory (DRAM), are particularly sensitive to GIDL. Moreover, significant transistor GIDL can induce leakage at storage nodes of a memory array. Accordingly, gate oxides in memory arrays must be effective at resisting GIDL for proper operation.

Transistors leakage tends to occur at gate edges, where electric fields are concentrated. Accordingly, one partial solution to the problem of GIDL, where conventional oxides are used for the gate dielectric, is to perform a re-oxidation process. The re-oxidation is performed after forming gate electrodes, such that the gate oxide edges under the gate electrode corners are thickened relative to the remainder of the gate oxide dielectric. However, metals used in word lines (part of which form the gate electrodes) are susceptible to degradation during the re-oxidation process. Recently popular word line materials, such as tungsten, are particularly susceptible to oxidation.

Peripheral circuits of a DRAM chip generally include logic circuits, such as address decoders and read/write control circuits. These logic circuits in the periphery of the memory chip, in contrast to memory array transistor, require faster transistor switching times. Such aggressive operation is facilitated by thinner gate oxides in these peripheral circuits. Logic circuits also tolerate a higher GIDL current, as compared to memory arrays, such that thinning gate oxides within the peripheral areas may be feasible from a GIDL standpoint.

In order to accommodate the differing needs of the memory array and peripheral circuits, the circuit design can include two or more different thicknesses of gate oxide on the same silicon substrate. According to the prior art, different thicknesses of gate oxide have been formed by selective oxidation through an existing thin oxide layer (in areas which require thick oxides), or by selective etching of an existing oxide layer (in areas which require thinner oxides). Either selective oxidation or etching, require at least one additional mask, which increases the cost of fabrication.

Moreover, thin gate oxides in field effect transistors are more easily worn out due to the injection of hot electrical carriers through the channel which is formed below the thin oxide. Such oxide wear out may reduce reliability, yield and/or life span of the device.

Therefore, a need exists for processes and structures which address the various needs of memory arrays and logic circuits.

SUMMARY OF THE INVENTION

In accordance with one aspect of the invention, an integrated circuit is provided. The circuit includes a semiconductor substrate with adjacent first and second areas, and first and second transistors gate electrodes are formed over the first and second areas, respectively. A first gate dielectric, including a non-oxide material, is positioned between the first transistor gate electrode and the substrate in the first area. A second gate dielectric is positioned between the second transistor gate electrode and the substrate in the second area. Where x represents the equivalent oxide thickness of the first gate dielectric, the second gate dielectric has an equivalent oxide thickness of at least about 1.1x.

In accordance with another aspect of the invention, a system is provided with a semiconductor substrate, including first and second transistors. Each of the first transistors has a first gate insulator, including silicon nitride, and each of the second transistors has a second gate insulator formed of silicon oxide.

In accordance with another aspect of the invention, an integrated memory chip is provided. The chip includes logic circuits and memory array circuits on a semiconductor substrate. Transistor gate dielectrics in the logic circuits include a layer of a first material, while transistor gate dielectrics in the memory array circuits are formed of a second material. The dielectric constant of the first material is different from the dielectric constant of the first material.

In accordance with still another aspect of the invention, a memory chip is provided with at least one memory array and a logic circuit. The memory array has array gate electrodes separated from a semiconductor substrate by a gate oxide. The logic circuit has logic gate electrodes separated from the substrate by an gate dielectric, which includes silicon nitride and silicon oxide. The equivalent oxide thickness of the gate oxide is greater than the equivalent oxide thickness of the gate dielectric.

In accordance with another aspect of the invention, a process is disclosed for optimizing gate insulator characteristics in different regions of an integrated circuit formed in a semiconductor substrate. The process includes forming a non-oxide dielectric layer over a first region of the substrate. An oxide layer is grown through the non-oxide dielectric layer in the first region of the substrate. Simultaneously, an oxide layer is grown in an exposed second region of the substrate, which is situated adjacent the first region.

In accordance with yet another aspect of the invention, a method is disclosed for fabricating a memory chip. Logic circuit and memory array regions are defined in a substrate. A silicon nitride layer is deposited over the substrate in both regions. A mask is formed over the silicon nitride layer in the logic circuit region, and a portion of the silicon nitride layer removed from the substrate in the memory array region. Then the mask is removed, followed by an oxidation.

BRIEF DESCRIPTION OF THE DRAWINGS

These and other aspects of the invention will be apparent from the following description and from the appended drawings, wherein like numerals refer to like parts and wherein.

DETAILED DESCRIPTION OF THE PREFERRED EMBODIMENT

The preferred embodiment of the present invention is directed to forming gate dielectrics in the context of dynamic random access memory (DRAM) integrated circuits. It will be recognized by one of skill in the art of semiconductor fabrication, however, that the invention will have applications for other circuits where gate dielectrics of different characteristics are desired in different regions of the same substrate.

Figure 1:
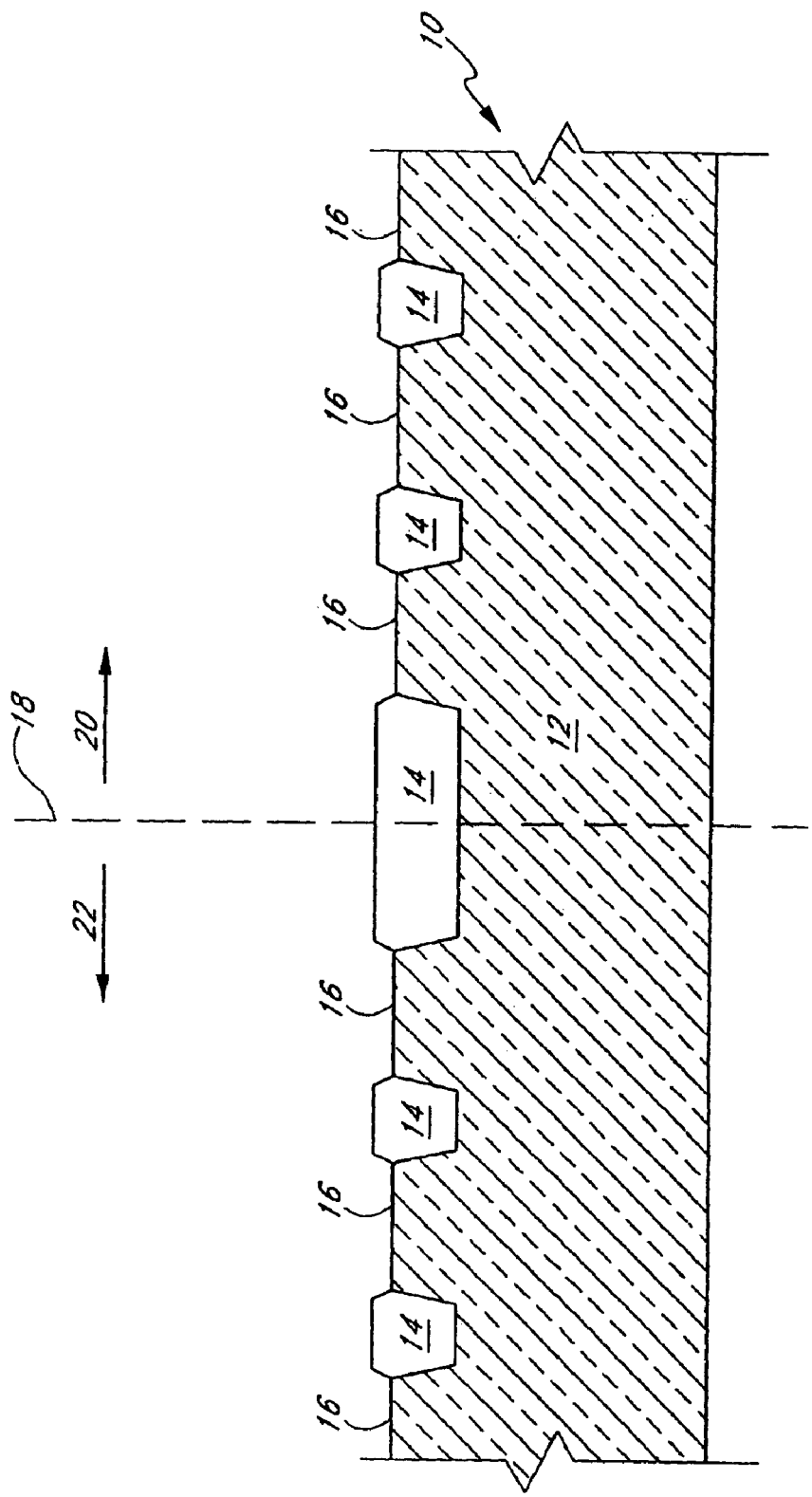
FIG. 1 is a partial cross-sectional view of a semiconductor substrate, including both memory array and peripheral regions, with device isolation elements formed on the top surface of the substrate.

Referring initially to FIG. 1, a partially fabricated integrated circuit or workpiece 10 includes a substrate 12 and a plurality of shallow trench isolation elements or moats 14 formed in the surface of the substrate 12. It will be understood, of course, that in other arrangements field isolation can be accomplished by any of a number of variations on local oxidation of silicon (LOCOS), such as recessed, semi-recessed, etc., or by any other suitable process. Shallow trench isolation, however, is preferred for high density, sub-quarter-micron applications. Transistor active areas 16 are defined between isolation elements 14 in the substrate, such that the elements 14 ultimately isolate circuit devices formed from the active areas 16.

While the illustrated substrate 12 comprises the upper portion of a single-crystal silicon wafer, the substrate in general represents the lowest layer of semiconductor material in the integrated circuit in which active areas of devices will be formed. In other arrangements, for example, epitaxial layers of semiconductor material can be formed over silicon, glass, or other supporting structures.

In accordance with state of the art memory chip fabrication, multiple chips are typically formed simultaneously on a single wafer or workpiece 10. As will be understood by the skilled artisan, each chip includes a plurality of memory arrays and peripheral logic circuits for controlling read/write operations to the memory arrays. For description purposes, an imaginary line 18 is shown dividing the substrate 12 into a memory array area 20, shown on the right side of FIG. 1, and a peripheral area 22, shown on the left side of FIG. 1. In the memory array area 20, transistors will be formed and latched to capacitors to form memory cells for storing data bits, and the cells are interconnected by word and bit lines. On the other hand, logic circuits will be formed in the peripheral area 22 to control reading and writing to the memory cells. The process of the present invention is performed at the initial fabrication stages of the memory device.

Although not illustrated, a sacrificial oxide layer is preferably grown on the top surface of the substrate 12 and stripped off prior to the process illustrated herein. This sacrificial growth and stripping is known to clean out the surface of the active area 16 of the substrate 12, on which various circuits will be formed. It will be appreciated that the growth and removal of such sacrificial oxide is known in the art and can be integrated in a variety of ways.

Figure 2:
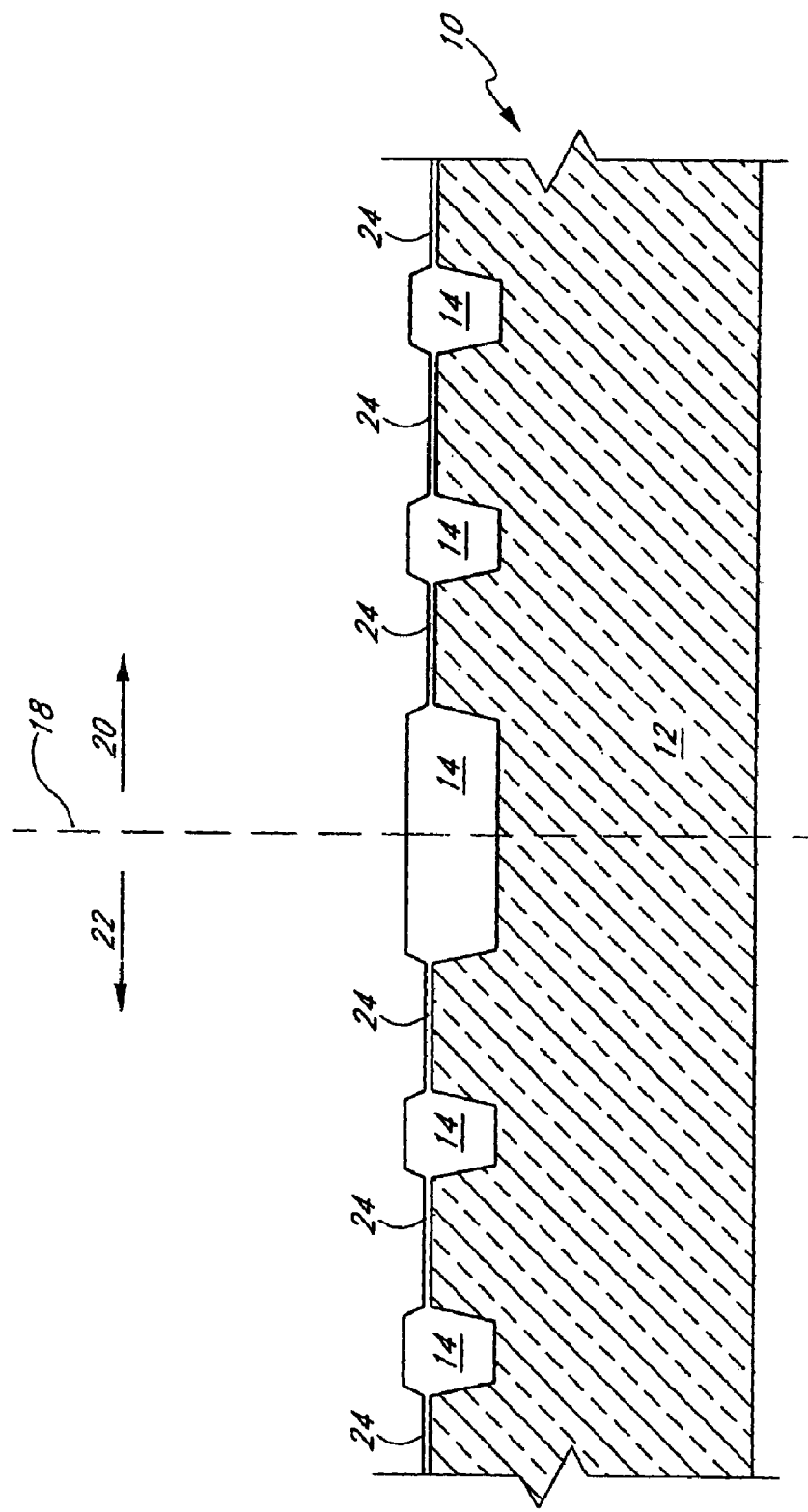
FIG. 2 is a view of the substrate of FIG. 1 after a thin oxide layer has been grown over the substrate.

With reference to FIG. 2, a first silicon oxide layer or film 24 is formed on the surface of the active areas 16 in both the array and peripheral areas 20, 22. As will be apparent from the remainder of the process and the final gate dielectric structures, formation of the thin oxide film 24 at this stage is preferred but optional. The thickness of the first oxide film 24 is preferably between about 0 Å and 25 Å, more preferably between about 13 Å and 18 Å, and most preferably about 15 Å. While thinner layers may be desirable for faster switching times, formation of thermal oxides of less than 10 Å is generally difficult to repeat with consistency from wafer to wafer with current processing technology, though thinner may dielectrics may be feasible for future generations. The thin oxide layer 24 is preferably grown by thermal oxidation, and most preferably by rapid thermal oxidation (RTO). Those of skill in the art of semiconductor processing can readily determine suitable parameters for thermal oxidation in general, and RTO in particular. It will also be appreciated that deposition techniques such as chemical vapor deposition can be employed for forming high quality silicon oxide films.

Figure 3:
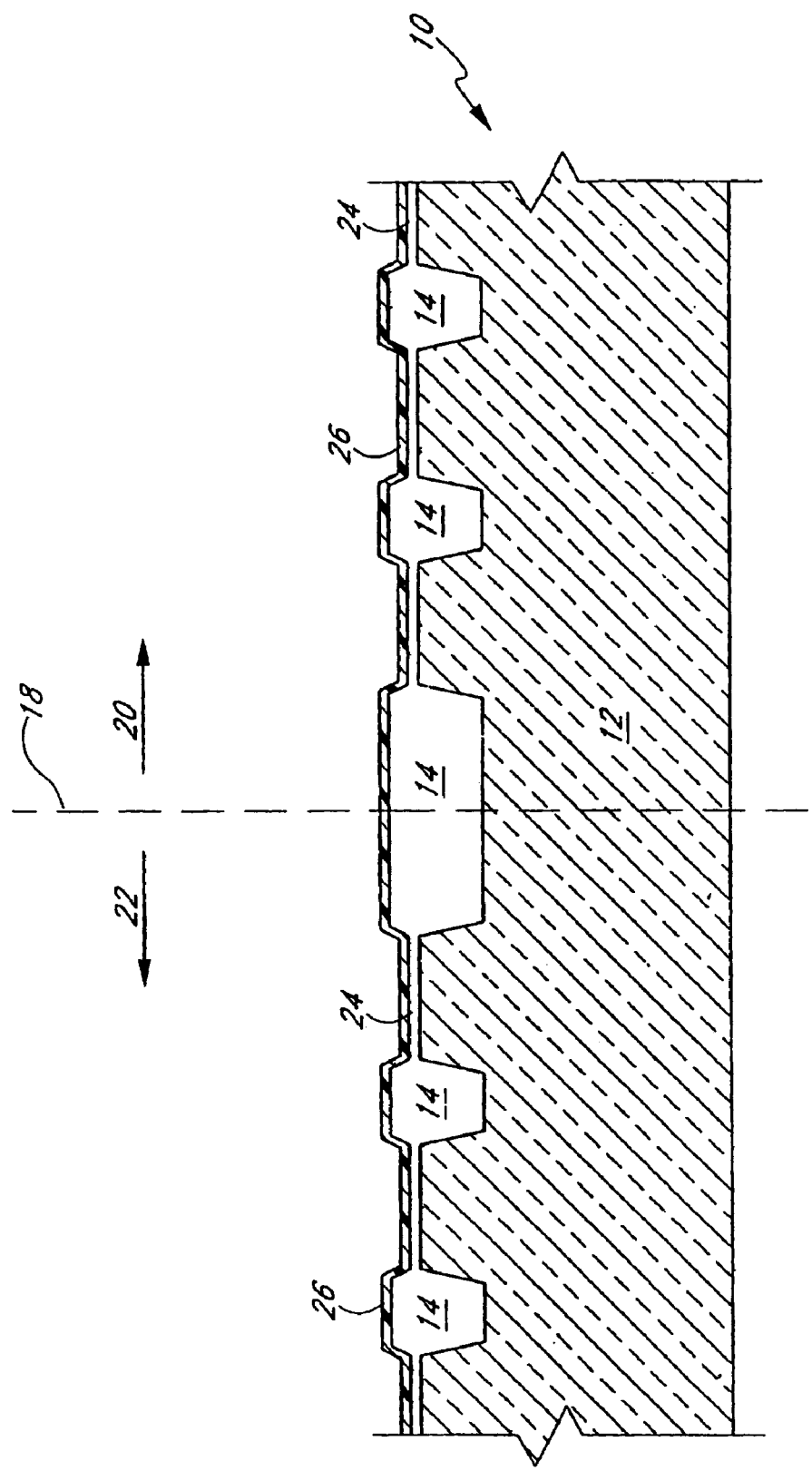
FIG. 3 shows the result of depositing a thin nitride layer over the structure of FIG. 2.

Referring to FIG. 3, a thin silicon nitride ($Si_3N_4$) film or layer 26 is formed over the oxide layer 24. The nitride layer 26 is preferably deposited to a thickness from about 5 Å to about 35 Å, more preferably between about 15 Å and 25 Å, and most preferably about 20 Å. The silicon nitride film 26 is preferably deposited by a chemical vapor deposition (CVD) process, in which a silicon source gas such as silane ($SiH_4$) is reacted at the surface of the substrate 12 with a nitrogen source gas such as ammonia ($NH_3$). CVD of silicon nitride is well-understood in the art of integrated circuit fabrication. Most preferably, rapid thermal processing technology is employed for time and cost efficiency. RTCVD is also well-known in the art.

Advantageously, the preferred material (silicon nitride) for this non-oxide dielectric is a harder material than silicon oxide, and therefore more resistant to wear out from hot carrier injection. Additionally, the preferred material can be selectively etched relative to silicon oxide, entailing processing advantages, as will be apparent from the disclosure below.

Figure 4:
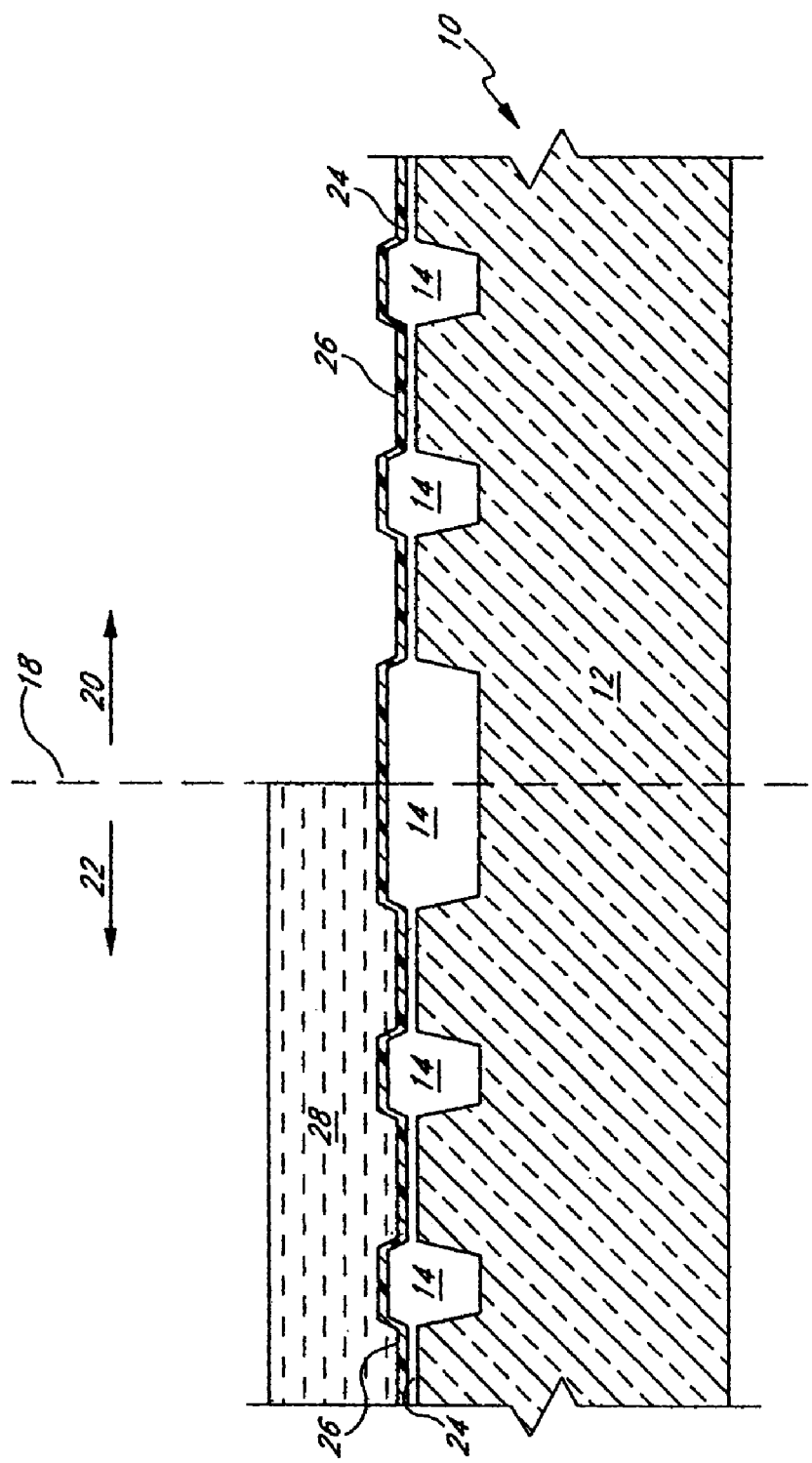
FIG. 4 shows the structure of FIG. 3 after forming a photolithographic mask over peripheral area.

With reference to FIG. 4, a mask 28 is then formed to isolate the peripheral area 22. In the illustrated embodiment, the mask 28 is formed by conventional photolithographic techniques. Typically, organic photoresist is formed over the substrate 12 and selectively exposed to developing light. Developed or undeveloped portions are then selectively removed, depending upon whether a positive or negative photoresist is employed. As a result of this selective removal, the mask 28 is left covering the peripheral area 22, as shown in FIG. 4. In conventional processing, such a mask 28 is employed at this stage of processing to implant impurities into all active areas 16 of the substrate 12 of the memory array areas 20. This implantation step, which effectively sets the threshold voltage for transistors in the memory array, is referred to in the art as a blanket $V_t$ implant. For example, There the background doping of the substrate 12 is n-type, the $V_t$ implant is of p-type impurities, leaving an n-type channel.

In the illustrated embodiment, the same mask 28 further serves to protect the dielectric layers 24, 26 in the periphery 22, while the same layers are removed from the memory array areas of substrate 12, as will be described presently. Advantageously, the present process for forming dual gate dielectrics utilizes an existing mask from the conventional process and therefore requires no extra masks. Moreover, the mask defines openings over memory arrays, which represent a large block of memory cells having a specific density. As such, alignment of this mask is not critical, as compared to the much finer features defined by other masks in integrated circuit processing.

Figure 5:
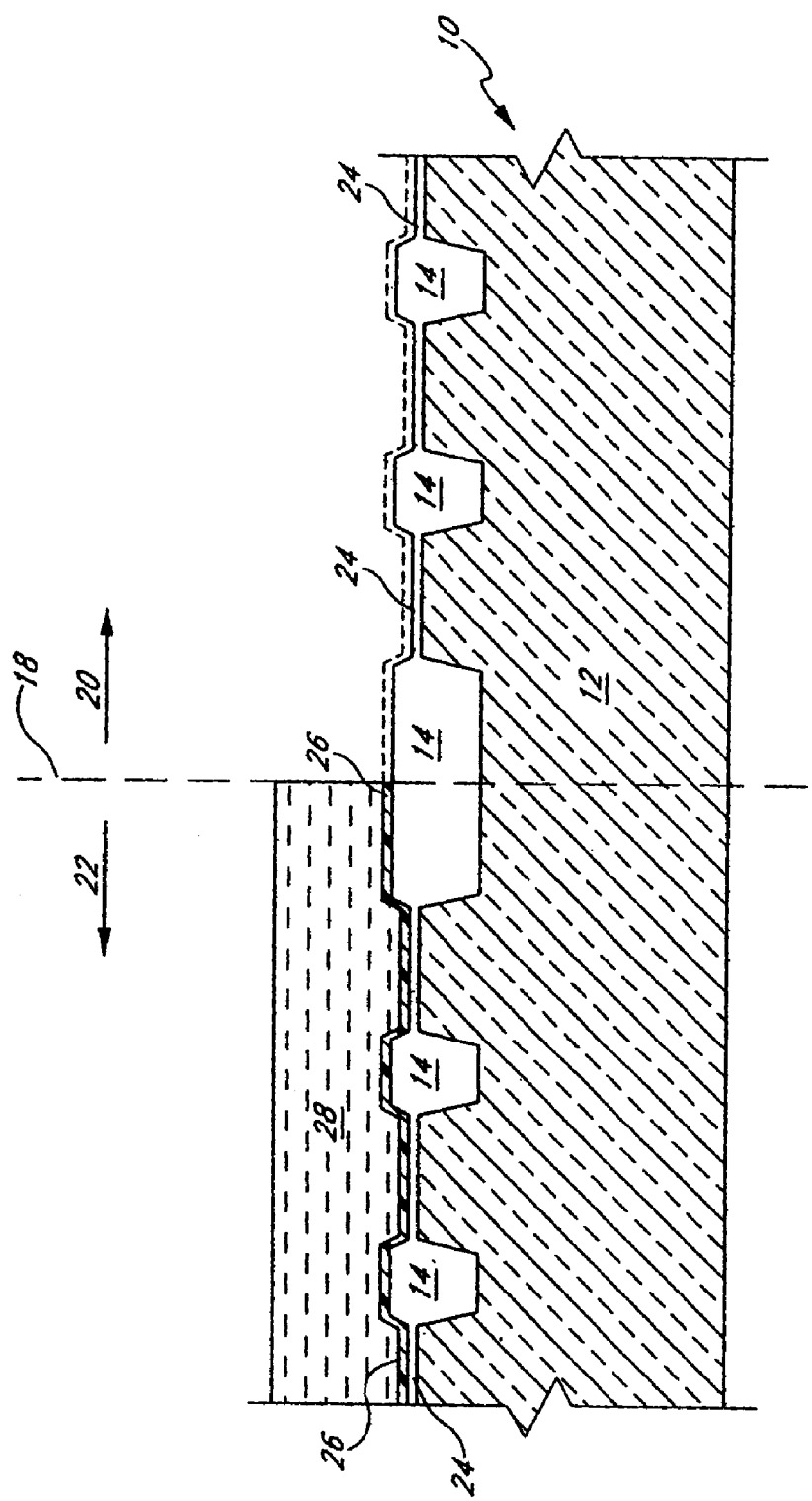
FIG. 5 shows the substrate of FIG. 4 after the nitride layer has been removed from a memory array area.

With reference to FIG. 5, the nitride layer 26 is then removed from the memory array area 20. Preferably, the nitride is etched selectively relative to the underlying oxide 24. In addition to selectivity over the underlying material, the etch process should avoid excessive damage to the photoresist mask 28, which protects the nitride layer 26 over the periphery 22. Because the features at issue are large (e.g., array areas are greater than 50 µm and generally several hundred microns across), minor damage to the mask is tolerable. In the illustrated embodiment, a wet chemical etch is preferably performed at relatively low temperatures, to avoid damaging the photoresist mask 28. The wafer 10 is immersed into a phosphoric acid etch bath, for example, until the nitride layer 26 is removed. Photoresist can typically withstand temperatures of up to 70° C. for a few minutes. The temperature of the etch bath, however, is preferably kept below about 50° C., more preferably under about 35° C. In the illustrated embodiment, the temperature of the etch bath is kept at about 30° C., such that the preferred nitride layer of about 20 Å is removed in 5 minutes. The skilled artisan will appreciate that other etch chemistries and parameters can accomplish the same objectives.

If the previous oxide growth has not been performed, then the nitride 26 would be removed selectively against the underlying substrate 12. Such an option is less preferred due to the relatively more difficult selective etch of nitride from over silicon, particularly where selective dry etch is to be employed. Moreover, if the substrate is directly exposed wet phosphoric acid etching of silicon nitride, with no intervening silicon oxide, the dopant profile of transistor active areas can be affected by the phosphor in the wet etch.

Figure 6:
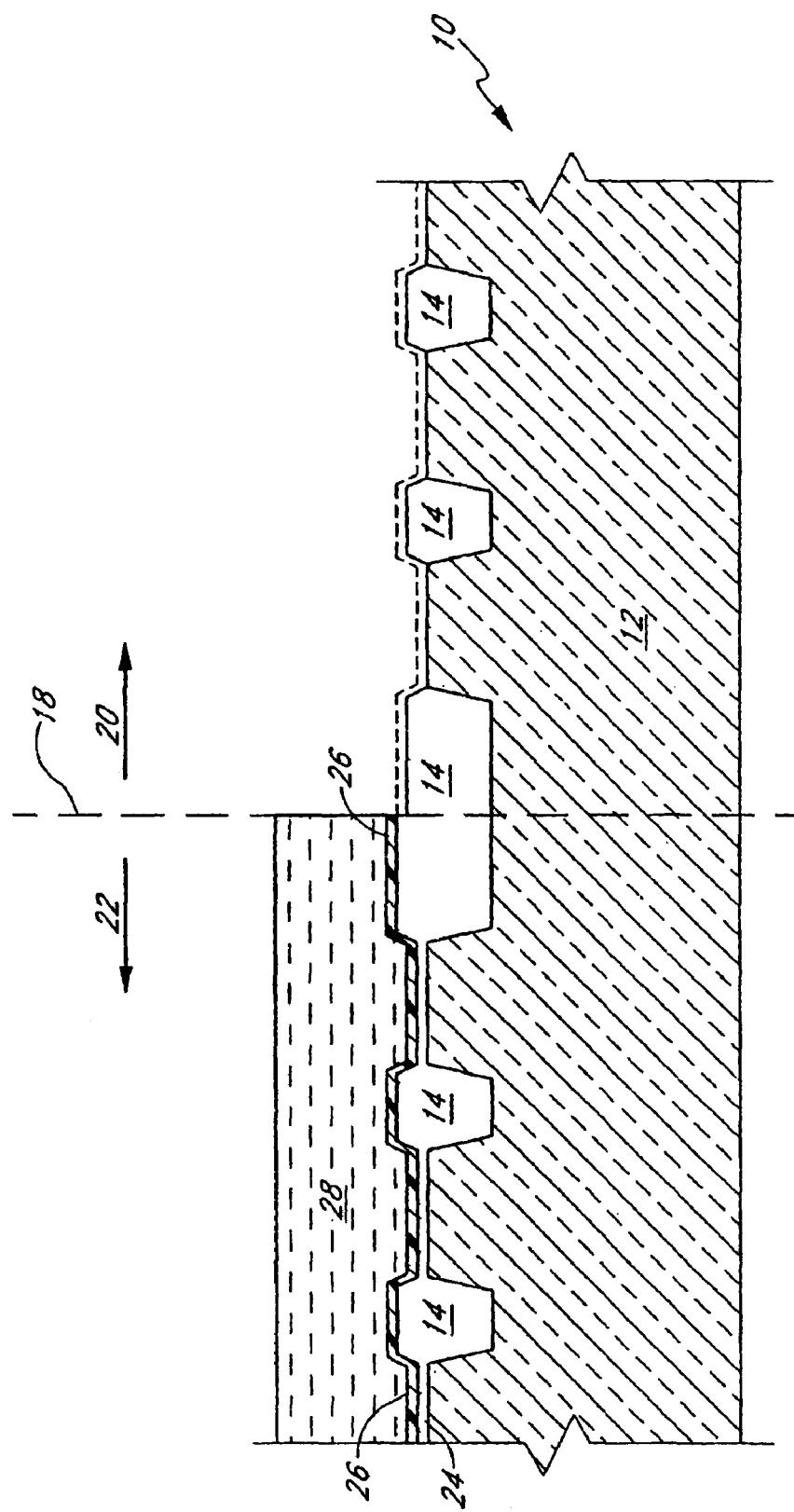
FIG. 6 shows the structure of FIG. 5 after removing the oxide layer from the memory array area.

Following the removal of the nitride layer 26, the optional oxide layer 24 of the preferred embodiment is exposed in the memory array area 20, as illustrated in FIG. 6. As with the removal of the nitride film 26, the oxide layer 24 is preferably removed by a wet chemical etch in which the photoresist mask 28 continues to protect the underlying layer 26 and oxide film 24 in the periphery 22. For example, the wafer 10 can be dipped into a hydrofluoric acid (HF) bath at less than about 35° C., more preferably less than about 30° C. (about 27° C. in the preferred embodiment) until the oxide film 24 is removed. The HF dip selectively removes oxide relative to the underlying silicon, while low temperatures prevent damage to the photoresist 28. As will be understood, this etching can also be substituted with other suitable selective etch chemistries. While not required in view of the subsequent oxide re-growth (see FIG. 6 and accompanying text), the oxide removal is preferred due to damage to this layer likely to be caused by the silicon nitride etch. Moreover, the oxide etch can be employed even when the optional oxide layer 24 is omitted, as native oxide and minor damage from the $V_t$ implant can be cleaned up.

Figure 7:
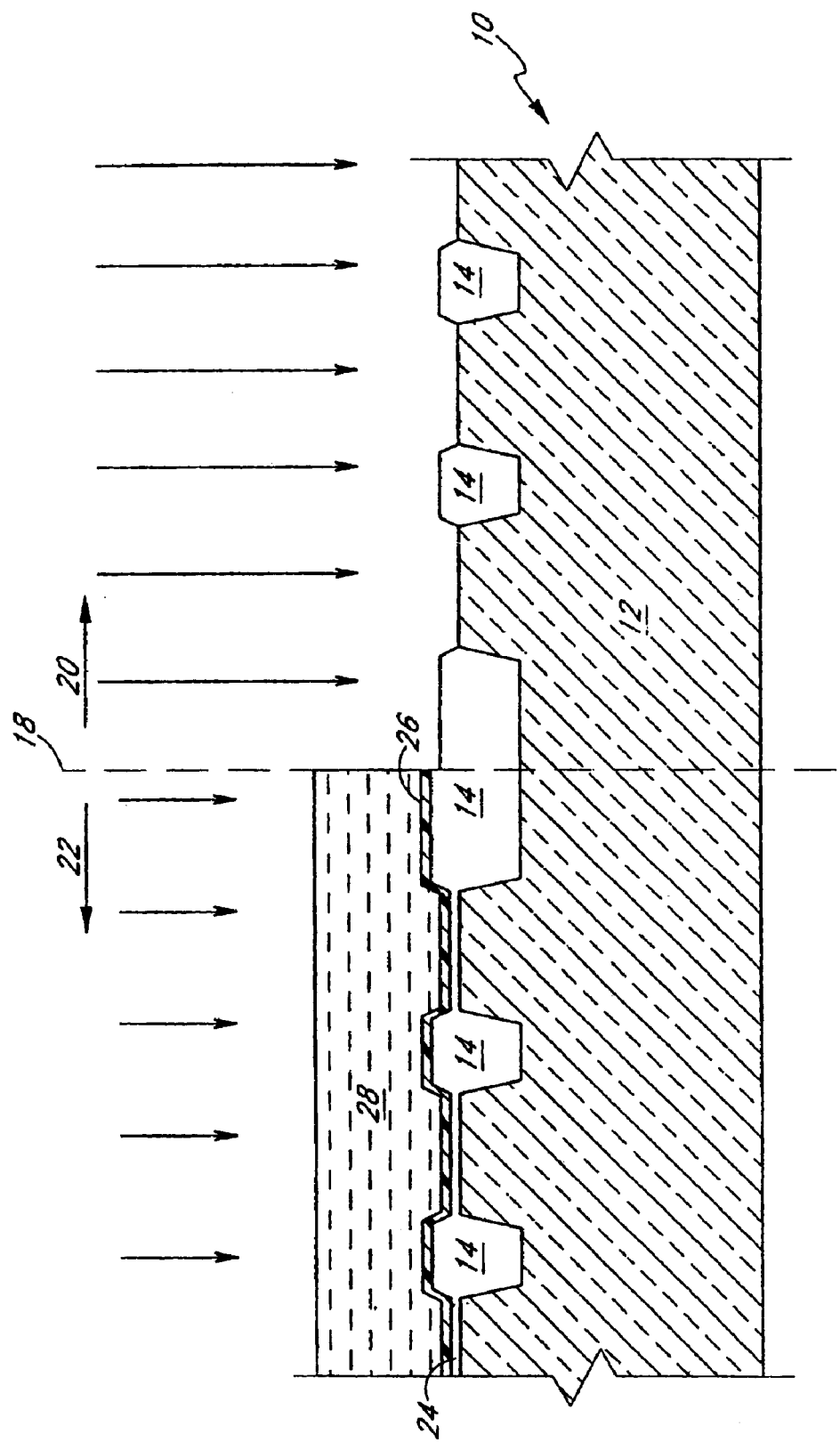
FIG. 7 illustrates impurities being implanted in the memory array of FIG. 6.

As illustrated in FIG. 7, the blanket $V_t$ implant can be performed at this stage, after the removal of the nitride layer 26 and/or oxide layer 24 from over the memory array. It will be understood, however, that this implant can be equally well performed through the oxide and/or nitride layers prior to their removal.

Figure 8:
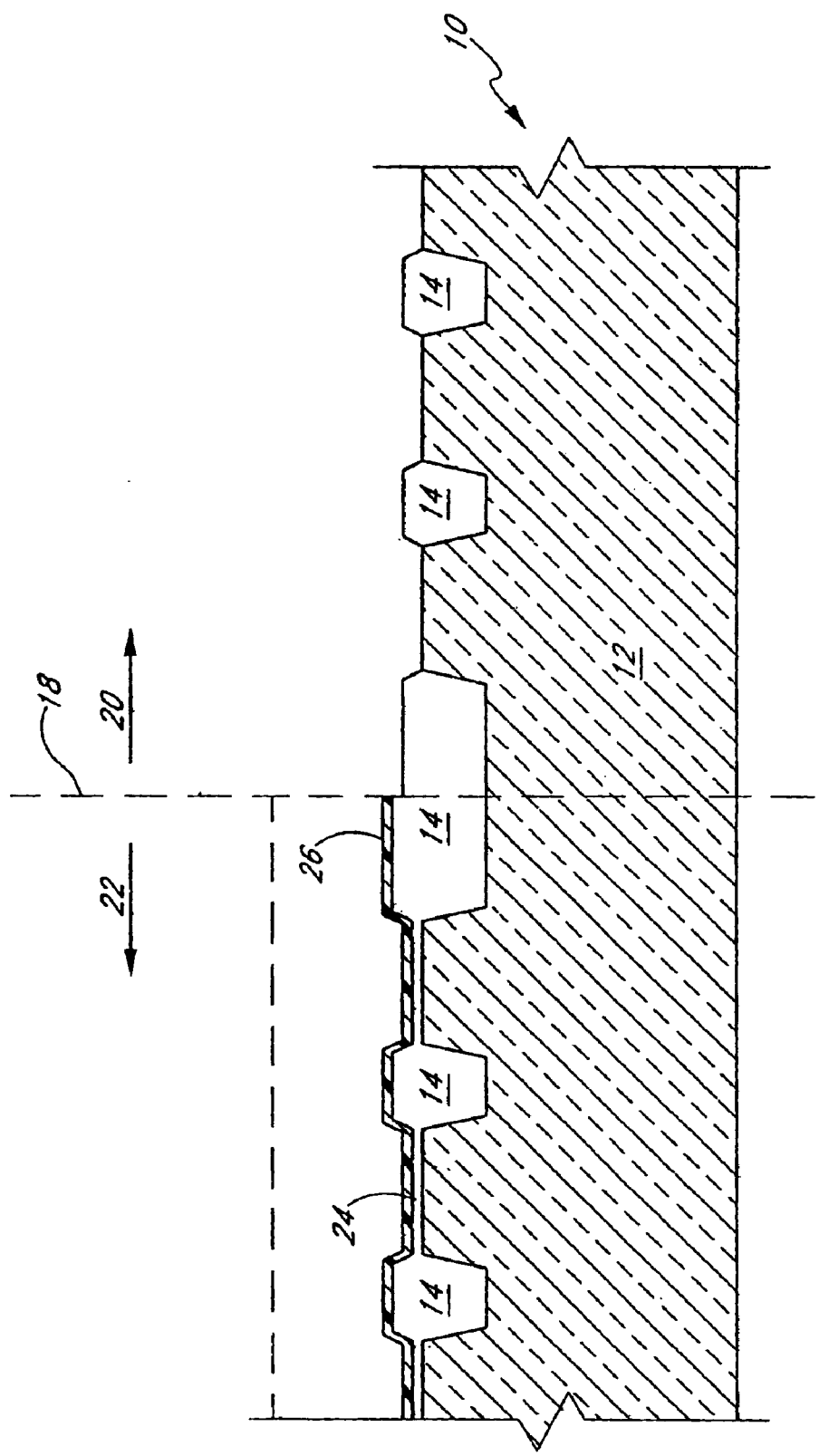
FIG. 8 shows the structure of FIG. 7 upon removal of the resist mask.

Referring now to FIG. 8, the photoresist mask 28 is removed by conventional stripping processes after the selective etches. For example, the resist can be burned off in an ozone process and the wafer rinsed with deionized water.

Figure 9:
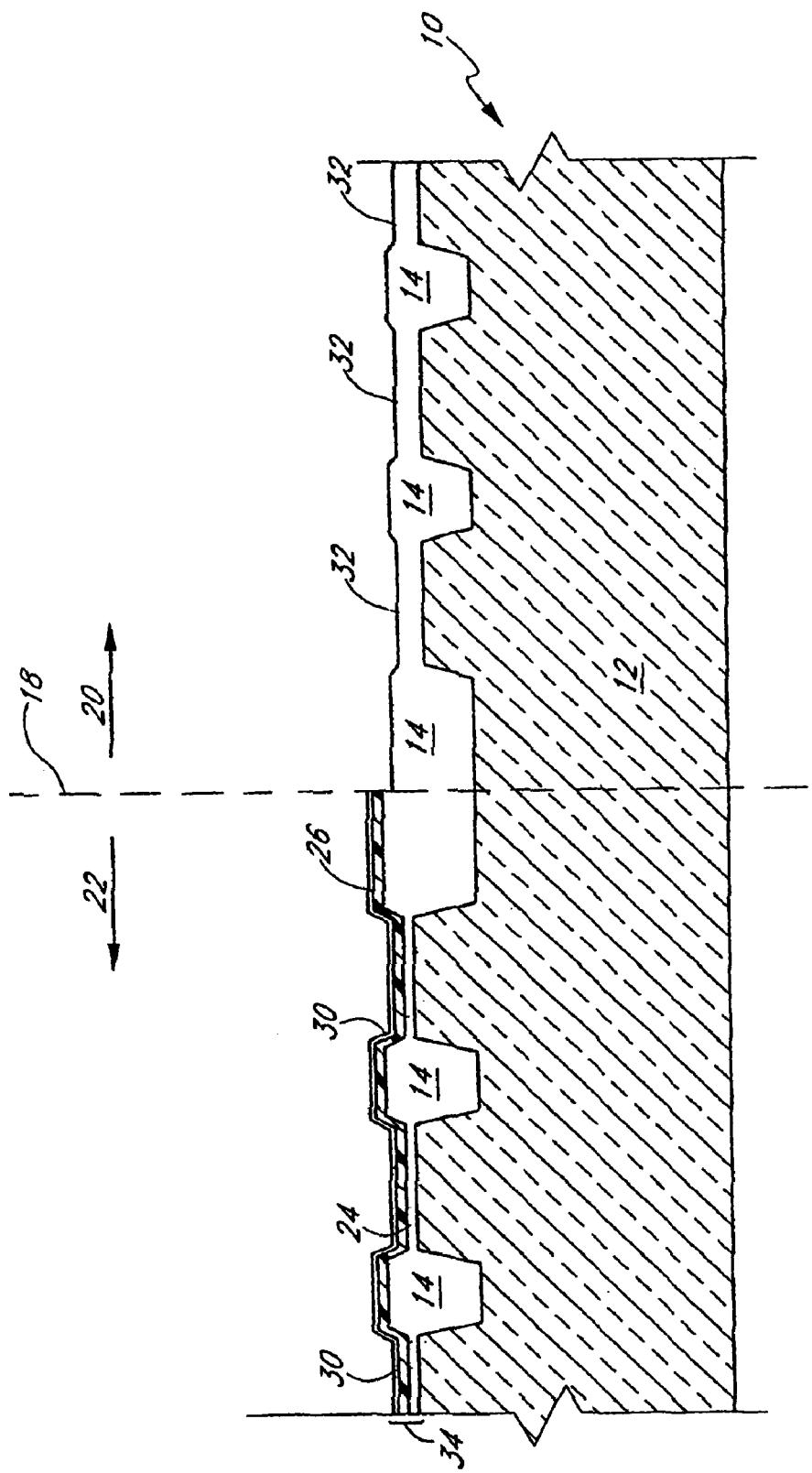
FIG. 9 shows the structure of FIG. 8 after a second oxidation.

Referring to FIG. 9, following the resist strip, both the periphery 22 and the memory array area 20 are subjected to thermal oxidation, such as rapid thermal oxidation (RTO) or batch furnace oxidation. The oxide grows differentially in the memory array area 20 and the periphery 22. In the peripheral region 22, oxygen diffuses slowly through the nitride layer 26 to slightly thicken the underlying oxide 24 by about 5 Å. At the same time, a very thin second oxide film 30 grows over the nitride layer 26, typically less than about 5 Å, for example about 2 Å to 3 Å. The second oxide film 30 grows from excess silicon within the silicon nitride layer 26, as well as any silicon which diffuses upwardly through the first oxide layer 24 and the nitride layer 26. Oxide growth in both layers 24 and 30 during the second oxidation, of course, depends upon the thickness of the nitride layer 26 through which oxygen diffuses. Thus, growth in the underlying layer 24 can range between about 5 Å and 10 Å for the preferred ranges of thickness of the nitride layer 26, while the overlying oxide layer 30 can range in thickness between about 5 Å and 10 Å.

On the other hand, an oxide 32 grows comparatively quickly on the naked silicon substrate 12 in the active area 16 of the memory array 20. For present generation DRAM circuit design, with a minimum feature size of about 0.20 µm or lower, the oxygen layer 32, which represents the full gate dielectric in the array area 20, is preferably grown to a thickness to about 60 Å to 80 Å, and more preferably between about 70 Å and 80 Å. It will be understood, however, that optimal gate dielectric thickness for the memory array depends upon a variety of factors determined by the circuit design, such that the actual thickness can vary for different circuit designs. For example, in integrated circuits employing 0.15 µm technology (0.13 µm, 0.10 µm etc.), all features may be sealed down.

In the illustrated embodiment, a peripheral gate dielectric 34 thus comprises an oxide-nitride-oxide (ONO) structure, with the most preferred dimensions being about 20 Å of silicon oxide 24 immediately adjacent the substrate 12; 20 Å of silicon nitride 26 thereover; and about 2 Å to 3 Å of silicon oxide 30 over the nitride 26. This actual ONO thickness of about 42 to 43 Å translates to an equivalent oxide thickness of about 50 Å, as will be understood in the art. An equivalent oxide thickness is defined as the thickness of pure silicon oxide which would have the same insulating or capacitive effect as the ONO structure (or other non-oxide dielectric). In general, the equivalent oxide thickness of the peripheral gate dielectric 34, regardless of its precise construction, is preferably less than about 60 Å, and more preferably less than about 50 Å.

The equivalent oxide thickness of the ONO layer 34 represents about two-thirds of the oxide thickness of the memory array gate dielectric 32. This ratio can vary slightly in accordance with the above-discussed variability of the various steps in the process.

In general, however, the peripheral gate dielectric 34 has a smaller equivalent oxide thickness than the array gate dielectric 32, such that the logic circuits in the peripheral region 22 can operate with faster switching speeds than the transistors within the array region 20. If the peripheral gate dielectric 34 is assigned an equivalent oxide thickness of x, the array dielectric 32 has an equivalent oxide thickness greater than x, preferably between about 1.1x and 4x, more preferably between about 1.3x and 1.7x, and most preferably about 1.5x. In future generations of integrated circuits, these ratios will change, as will be understood by the skilled artisan, due to differing needs of circuits in different generations.

Moreover, despite the thinner overall gate dielectric 34 in the peripheral region 22, the presence of the nitride layer 26 within the peripheral gate dielectric 32 means that the peripheral gate dielectric 34 represents a harder material than the gate dielectric 32 in the memory array area 20. The harder nitride resists hot carrier injection, and therefore does not wear out as easily as an equivalent pure oxide insulator would. Thus, the peripheral circuits can operate at faster switching speeds, as is desirable for logic circuits in the peripheral area 22, while exhibiting the durability of a thicker oxide layer. At the same time, GIDL-sensitive circuits in the memory array can be grown more thickly (e.g. 70 Å to 80 Å), reducing or obviating the need for traditional remedies for GIDL, such as gate corner re-oxidation.

The integrated circuit can thereafter be completed by conventional fabrication processes, including deposition of gate and strapping word line layers followed by photolithographic definition of the gates and completion of the transistors. Significantly, polysilicon gates can be strapped with metals susceptible to oxidation. Preferably, doped polysilicon is strapped with tungsten to enhance word line propagation speeds. Desirably, re-oxidation at the gate edges is omitted due to sufficient gate dielectric thickness in the memory array area 20.

As will be understood from the foregoing process, the first oxide 24 can be omitted. A thin oxide layer would still grow under the silicon nitride during the oxidation following nitride deposition, for example about 5 Å to 10 Å thick. The initial oxidation is preferred, however, in order to protect the substrate 12 in the active areas 16 of the array 20 during etching of the silicon nitride 26 in this region (see FIG. 5 and accompanying text). Etching oxide selectively against an underlying silicon is generally less harmful to the underlying substrate than selectively etching silicon nitride from over a silicon substrate.

Accordingly, the processes and structures described here enable optimizing the construction of gate dielectrics in different regions of an integrated circuit. In particular, the dielectric can be made thinner for circuits requiring fast or aggressive operation, while the gate dielectric in leakage-sensitive circuits can be made thicker. At the same time, the thinner dielectric can be made harder to resist wear in demanding operational conditions. While the preferred material comprises silicon nitride, the skilled artisan will recognize other suitable dielectric materials for this purpose.

Moreover, the invention entails many process advantages. For example, the illustrated materials (silicon oxide and nitride) can be selectively etched, relative to one another, facilitating high quality dielectric layers with relatively simple integration. Due to hardness of the gate dielectrics in the logic circuits, potentially harmful remedial processes, such as gate corner re-oxidation, can be reduced or even omitted, facilitating integration of tungsten or other metals susceptible to oxidation. In addition, the disclosed process requires no additional mask as compared to conventional processes for unitary gate dielectrics, while the disclosed process still provides dual gate dielectrics for different circuits on the same chip. As is well known in the art, saving an additional mask step (by utilizing a mask existing in the conventional process flow) represents considerable cost savings in fabrication.

Although the present invention has been described in the context of certain preferred embodiments, it will be understood by the skilled artisan that various omissions, substitutions and changes may be made to the disclosed process without departing from the spirit of the present invention. Consequently, the scope of the present invention is not meant to be limited to the preferred embodiment, but is rather defined by reference to the appended claims.

We claim:

1. An integrated circuit, comprising:
   a semiconductor substrate having a first area and a second area, where the second area is adjacent to the first area;
   a first transistor gate electrode formed over the substrate in the first area;
   a second transistor gate electrode formed over the substrate in the second area;
   a first gate dielectric layer disposed between the first transistor gate electrode and the substrate, where the first gate dielectric layer includes a layer of silicon nitride that is sufficiently thin to permit the oxidation of underlying silicon therethrough; and
   a second gate dielectric layer disposed between the second transistor gate electrode and the substrate, the second gate dielectric layer having a thickness that is different than the equivalent thickness of the first gate dielectric layer.

2. The integrated circuit of claim 1, wherein the second gate dielectric layer comprises silicon oxide.

3. The integrated circuit of claim 1, wherein the second gate dielectric layer has a thickness that is greater than the equivalent thickness of the first gate dielectric layer.

4. The integrated circuit of claim 1, wherein the first gate dielectric layer further comprises a silicon oxide layer disposed between the silicon nitride layer and the substrate in the first area.

5. The integrated circuit of claim 4, wherein the first gate dielectric layer further comprises an oxide layer disposed over the silicon nitride layer.

6. The integrated circuit of claim 1, wherein a plurality of memory arrays are formed in the second area of the substrate.

7. The integrated circuit of claim 6, wherein a logic control circuit is formed in the first area of the substrate.

8. The integrated circuit of claim 7, wherein the first area is formed at the periphery of the second area.

* * * * *